(12) United States Patent
Kamei et al.

(10) Patent No.: US 6,462,412 B2
(45) Date of Patent: Oct. 8, 2002

(54) FOLDABLE, FLEXIBLE LAMINATE TYPE SEMICONDUCTOR APPARATUS WITH REINFORCING AND HEAT-RADIATING PLATES

(75) Inventors: Shigeki Kamei; Saeko Takagi, both of Oita (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/760,825

(22) Filed: Jan. 17, 2001

(65) Prior Publication Data
US 2001/0008306 A1 Jul. 19, 2001

(30) Foreign Application Priority Data
Jan. 18, 2000 (JP) ........................................ 2000-008534

(51) Int. Cl.$^7$ ............................................... H01L 23/34
(52) U.S. Cl. ........................ 257/723; 257/724; 257/706; 257/720; 257/696; 257/738; 257/780; 257/779; 257/777
(58) Field of Search ................................ 257/723, 724, 257/696, 738, 780, 779, 777, 706, 720

(56) References Cited

U.S. PATENT DOCUMENTS 5,652,608 A * 7/1997 Watanabe et al. ............. 347/50
6,208,521 B1 3/2001 Nakatsuka ................... 361/749
6,225,688 B1 * 5/2001 Kim et al. .................. 257/686

FOREIGN PATENT DOCUMENTS

JP 6-168985 6/1994
JP 11-135715 5/1999

* cited by examiner

Primary Examiner—David L. Talbott
Assistant Examiner—Luan Thai
(74) Attorney, Agent, or Firm—Rader, Fishman & Grauer, PLLC; Ronald P. Kananen, Esq.

(57) ABSTRACT

A laminate-type semiconductor apparatus utilizing a flexible substrate being mounted with a plurality of semiconductor devices, in which the laminate-type semiconductor apparatus is free from incurring heat-radiation problem and has a fully leveled connection parts with sufficiently durable strength whereby distinctively compatible with high-density mounting thereof. More particularly, the present invention provides a laminate-type semiconductor apparatus which comprises a foldable flexible substrate mounted with a plurality of laminated semiconductor devices thereon, in which the foldable flexible substrate is folded so that plurality of semiconductor-device mounting areas of the substrate are mutually superposed whereby forming a laminate structure of semiconductor-device mounting areas thereon. An externally connected terminal disposing area disposed with a plurality of externally connected terminals is formed on one surface thereof. In addition, a reinforcing plate is secured to the side of the externally connected terminal disposing area via a material portion (adhesive agent) having stress relaxing function. Further, a heat-radiating plate is secured onto a surface on the opposite side from the externally connected terminal disposing area.

9 Claims, 4 Drawing Sheets

FOLDABLE, FLEXIBLE LAMINATE TYPE SEMICONDUCTOR APPARATUS WITH REINFORCING AND HEAT-RADIATING PLATES

BACKGROUND OF THE INVENTION

1. Field of the Invention

The present invention relates to a high-density laminate-type semiconductor apparatus having a plurality of semiconductor devices mounted on a plurality of flexible substrates. In particular, the present invention relates to a laminate-type semiconductor apparatus using a plurality of foldable flexible substrates. The present invention is utilizable as an assembly structure of a variety of semiconductor apparatuses such as a MOSFET, MISFET and other field-effect transistors, for example, and yet, the present invention can also be utilized as a practical technique for fabricating a laminate-type semiconductor apparatus by way of using a plurality of foldable flexible substrates.

2. Description of the Related Art

Because of the demand for further downsizing and higher density, higher density mounting of component parts has thus been demanded for electronic apparatuses using semiconductor apparatuses. To achieve this, in semiconductor apparatuses being a constituent of the electronic component parts, there are such proposals with regard to so-called "chip-size-package (CSP)" or "multi-chip-module (MCM)" each having such a size substantially equivalent to that of a semiconductor apparatus, or such a laminate-type semiconductor package comprising plural elements laminated in the height direction for contraction of the mounting area, for example. The above-cited packages have already been provided for practical services.

There are various proposals with regard to the laminate-type semiconductor apparatus using a foldable flexible substrate having various semiconductor devices mounted thereon, which is laminated on predetermined areas of the folded substrate, and yet, this apparatus has actually been provided for practical use. It should be noted that the terms "foldable" mentioned in the present specification implies that the above-cited laminate-type semiconductor devices can be processed via lamination by allowing desired areas to be superposed with each other. In this case, clear fold is not always required, but insofar as lamination can be effected, and yet, insofar as flexibility is retained, even such a substrate with curved form, plate-form, tape-form or sheet-form may also be used. With regard to the laminate-type semiconductor-device mounted apparatus, refer to the Japanese Patent Application Laid-Open Publication No. HEISEI-11-135715/1999, for example.

There is such a proposal on a conventional laminate-type semiconductor apparatus or a semiconductor package as the one shown in FIG. 3 via a lateral sectional view.

According to the above-cited conventional laminate-type semiconductor apparatus, a plurality (four, in this case) of semiconductor elements comprising a first device 3, a second device 4, a third device 4, and a fourth device 30, are laminated in the vertical direction of FIG. 3. As shown in FIG. 4 via a development view, the first device 3, the second device 4, the third device 5, and the fourth device 30, are mounted on edge portions of crossed members of a cross-form flexible substrates before being folded into an assembly, whereby forming a laminated structure by way of superposing four devices one after another like the one shown in FIG. 3. The development view shown in FIG. 4 is illustrative of a position at which back surface shown in FIG. 3 corresponding to an externally-connected terminal disposing area 6 is visible on the upper side.

Detail of the development view shown in FIG. 4 will be described below. Initially, by way of utilizing a plurality of substrates made of polyimide resin, a plurality of flexible substrates foldable as a whole are assembled as shown in FIG. 4 via the development view. In this conventional example, the flexible substrates are assembled into a crossed formation. The center portion of the crossed substrates is determined as the externally-connected terminal disposing area 6 for accommodating an externally connected terminal 7 as shown in FIG. 3. Next, originating from the center portion, four of the semiconductor-device mounting areas 61, 62, 63, and 64, are independently formed via foldable wiring distributing areas 11, 12, 13, and 50, respectively, to complete formation of a wiring substrate 2. Individual semiconductor devices are mounted on respective semiconductor-device mounting areas 61, 62, 63, and 64 formed on the wiring substrate 2. More particularly, the above-referred semiconductor devices comprising the first device 3, the second device 4, the third device 5, and the fourth device 30, are mounted on the corresponding semiconductor-device mounting areas 61, 62, 63, and 64. This completes such a semiconductor apparatus having a plurality of semiconductor devices 3, 4, 5, and 30 mounted on the back-surface side (inside of the apparatus) of the externally-connected terminal disposing area 6.

Reference codes "a", "b", "c", and "d" shown in FIG. 4 respectively designate connecting parts between respective semiconductor-device mounting areas 61, 62, 63 and 64 and wiring extended areas 11, 12, 13 and 50.

In terms of such a semiconductor package comprising a laminated assembly of semiconductor devices laminated on a polyimide substrate, introduction of module structure has recently been promoted in the assembly of memory devices and also in the assembly of logic devices and memory devices. Because of this, the number of laminated layers tends to become greater. However, as the number of laminated layers increases, thermal radiation generated by individual elements becomes a critical problem. In the above-cited conventional laminate-type package, the laminate-type structure has the substrate 2 which is developed as shown in FIG. 4. On the other hand, as shown in FIG. 3, when forming a laminate-type package by serially laminating the first device 3, the second device 4, the third device 5, and the fourth device 30, individual lamination causes thermal radiation to grow to necessitate any counter-measure to deal with this problem.

Further, whenever laminating semiconductor devices on a flexible substrate, a problem may be generated by effect of folding stress via a folding process. For example, when forming a laminate-type package by way of folding a flexible polyimide substrate, because of the folding stress via the folding process, leveling effect can hardly be achieved throughout the above-referred externally-connected terminal disposing area 6, thus raising such a problem. Because of this, in order to improve effect of connection between the externally-connected terminal disposing area 6 and the substrate for accommodating it via a soldering process, it has thus been necessary to implement any measure to ensure leveling effect, in other words, improve the parallelism.

As was described above, in the conventional laminate-type semiconductor apparatuses, in order to achieve higher density of such a package mounted with laminated semiconductor devices, a laminate-type structure is formed by way of folding a flexible substrate which is made of a flexible polyimide plate or a polyimide tape, for example. However, when a number of semiconductor devices are laminated, it is quite difficult to suppress amount of heat generated by respective semiconductor devices to damage operating function of the package itself. On the other hand, in the case of lamination of semiconductor devices on a flexible polyimide substrate such as a flexible polyimide plate or a polyimide tape, for example, via a folding process, it had thus been necessary to implement any measure to level off the substrate before mounting semiconductor devices on the substrate via a soldering process, and yet, it had thus been necessary to fully ensure strength of the connected effect between them.

SUMMARY OF THE INVENTION

The object of the present invention is to fully solve the above-referred technical problems by way of providing a novel semiconductor apparatus which is free from incurring malfunction caused by thermal radiation even in the case of laminating a plurality of semiconductor devices on a flexible substrate, and yet, provided with a fully leveled substrate with sufficient strength whereby enabling the semiconductor devices to be mounted thereon in a high density.

In the semiconductor apparatus according to the present invention, initially, a flexible substrate is folded (it is also possible to utilize such a flexible substrate made of an opaque polyimide plate). Next, a plurality of semiconductor devices (four devices, for example) are serially laminated on the flexible substrate. Next, in order to fully level off an externally-connected terminal disposing area, a reinforcing plate is set on the part of the externally-connected terminal disposing area via a material portion having stress-relaxing function by means of adhesion with a gelled adhesive agent, for example. Next, a radiating plate is disposed on the surface of a side opposite from the externally-connected terminal disposing area of the above-referred flexible substrate.

Concretely, in the semiconductor apparatus based on the above structure, a radiating plate such as a copper plate, for example, is adhered onto the uppermost portion of the mounted semiconductor devices by means of adhesion with an adhesive agent. Further, in order to fully level off the externally-connected terminal disposing area, a reinforcing plate which is made of a ceramics plate is secured with an adhesive agent capable of relaxing stress.

By virtue of the above arrangement, it is possible to realize a high-density laminate type package which is free from being subject to restriction from thermal radiation characteristic and restriction on the bonding with a mother board for mounting semiconductor devices without damaging overall function of the package itself.

According to the present invention, it is possible to realize such a high-density laminate type package without being subject to restriction from thermal radiation characteristic, and yet, without damaging proper function of semiconductor devices.

The present invention specifies utilization of a folded structure of a flexible substrate. It should be understood, however, that, even if the flexible substrate is not manufactured by way of actually being folded, it is allowable for use insofar as it is complete with a folded structure in consequence. In the case of manufacturing the flexible substrate of the present invention via a folding process, even when the flexible substrate is not folded after fully mounting semiconductor devices thereon, it is still allowable for use insofar as semiconductor devices are mounted on the substrate with a folded form in consequence.

The Japanese Patent Application Laid-Open Publication No. HEISEI-6-168985/1994 discloses a structure for laminating reinforcing members in the art of using highly flexible film material in regard to a structure for mounting semiconductor devices. It should be understood however that the semiconductor apparatus specified in the above-identified Publication is not of a laminate type, and the technique disclosed therein is totally independent of the present invention.

DESCRIPTION OF THE PREFERRED EMBODIMENTS

Referring to the accompanying drawings, practical forms for implementing the present invention will be described below. It should be understood that the scope of the present invention is by no means limited to the illustrated embodiments.

In a preferred form for implementing the present invention, as a flexible substrate, a flexible polyimide substrate such as an opaque polyimide substrate, for example, is utilized. An externally connected terminal disposing area for disposing a plurality of externally connected terminals is formed on one surface. A plurality of semiconductor devices are independently provided on a foldable flexible substrate in such areas excluding the externally connected terminal disposing area. Further, in order to level off the terminal disposing area and improve strength thereof, a reinforcing member is disposed above the externally connected terminals in a direction of lamination. In addition, a radiating plate is disposed on the uppermost surface of the flexible substrate.

In a preferred form for implementing the present invention, it is so arranged that a metal plate is disposed above the externally connected terminals in the direction of lamination whereby improving strength of the terminal disposing area and leveling off the area.

Further, in order to deal with thermal radiation of semiconductor devices, it is so arranged that a radiating plate is disposed above the folded portion of the flexible substrate.

Referring further to the accompanying drawings, preferred forms for concretely implementing the present invention will be described below.

Figure 1:
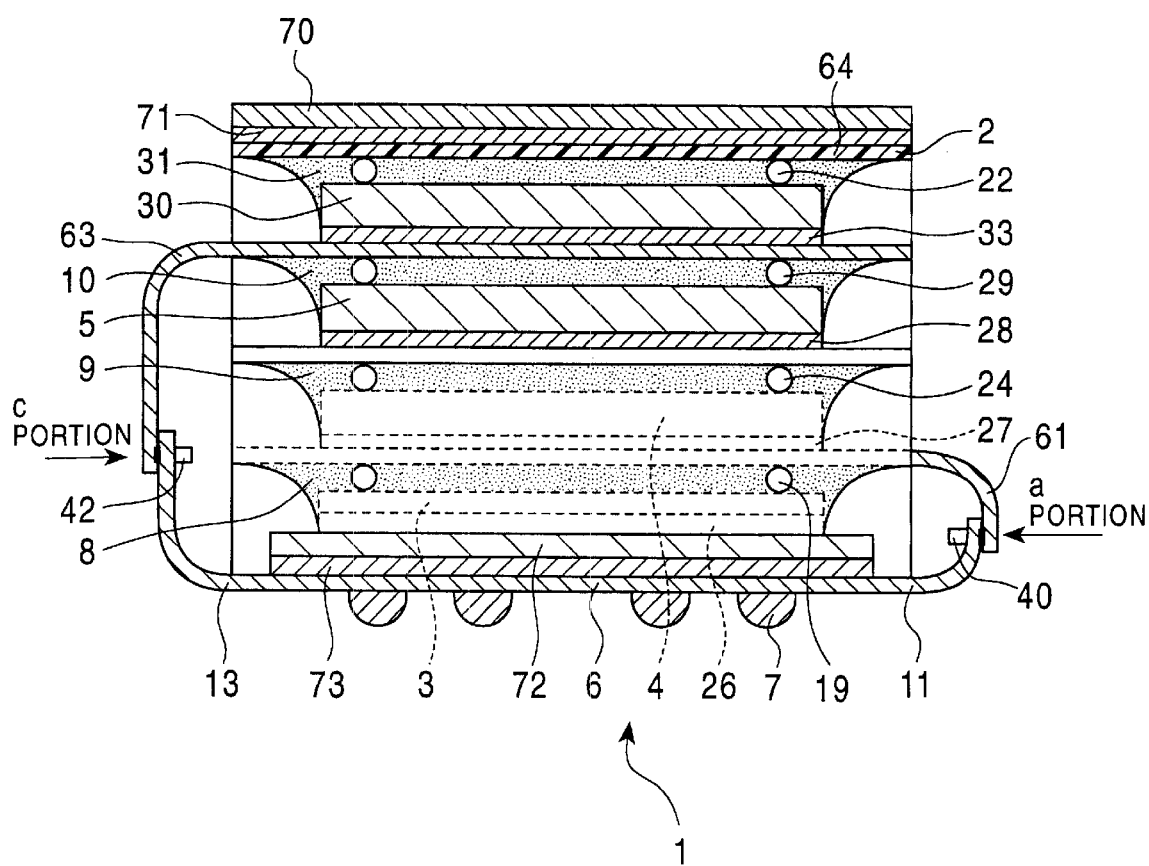
FIG. 1 is a summarized lateral cross-sectional view of the laminate-type semiconductor apparatus according to an embodiment of the present invention.
Figure 2:
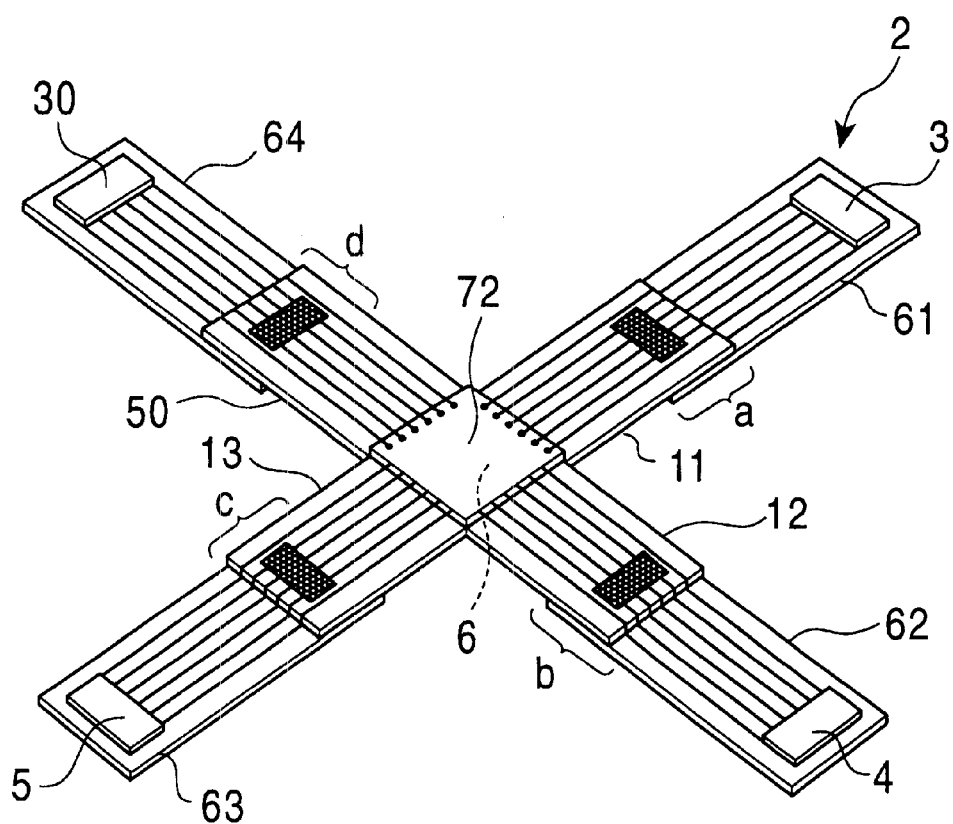
FIG. 2 is a summarized development view of the laminate-type semiconductor apparatus according to the embodiment of the present invention.
Figure 3:
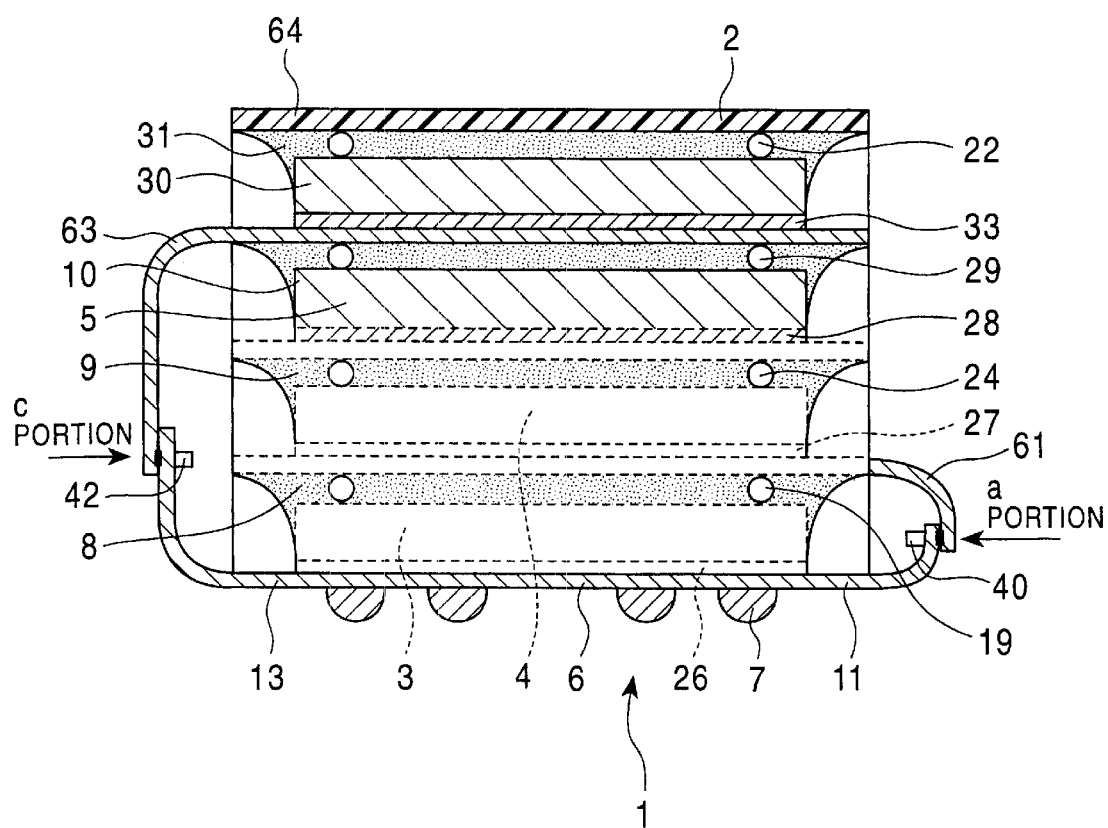
FIG. 3 is a summarized lateral cross-sectional view of the semiconductor apparatus according to a conventional art.
Figure 4:
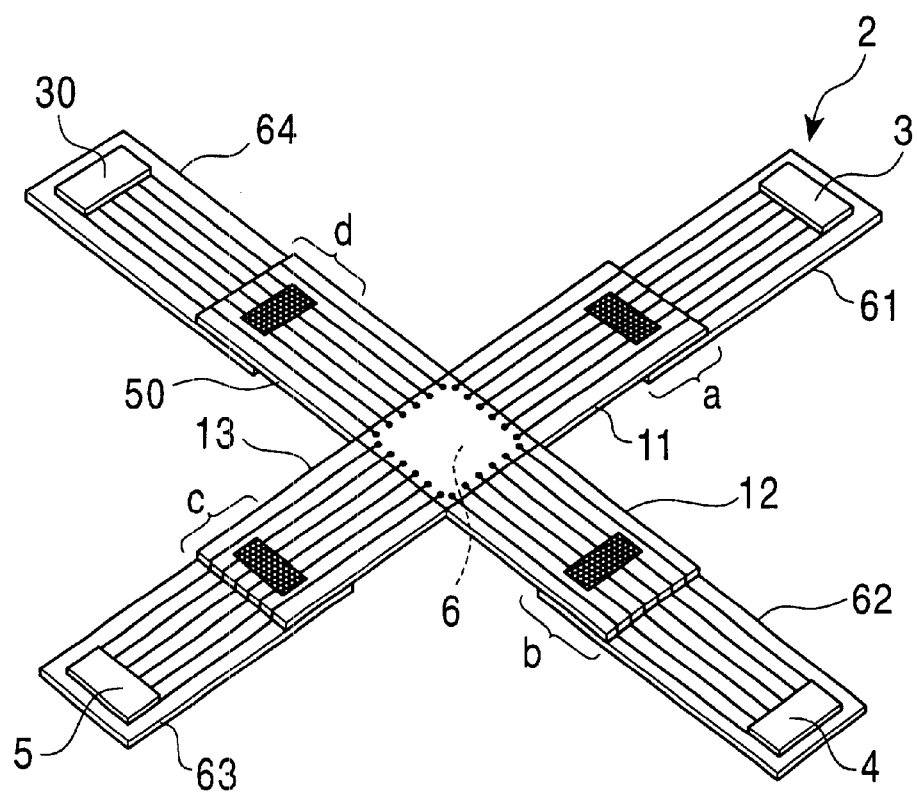
FIG. 4 is a summarized development view of the semiconductor apparatus according to the conventional art.

Now referring to FIGS. 1 and 2, an embodiment of the present invention will be described. FIG. 1 is a summarized lateral cross-sectional view of the laminate-type semiconductor apparatus according to the embodiment of the present invention. FIG. 2 is a summarized development view of the laminate-type semiconductor apparatus shown in FIG. 1. Among component elements shown in FIG. 1, the components shown in FIG. 2 mainly consist of lengthy substrates 2 and a plurality of semiconductor devices 3, 4, 5, and 30.

Refer now to FIG. 1. As shown here, a first device 3, a second device 4, a third device 5, and a fourth device 30 are serially laminated from the bottom of the drawing via projected electrodes 19 (bumps). The substrate 2 mounting the above-referred devices 3, 4, 5, and 30, is comprised of an insulating material made of polyimide resin, for example. The substrate 2 itself comprises wiring material made from copper which is patterned into a predetermined form provided inside of the insulating material and an insulating protection film. The substrate 2 itself is flexible and foldable, which is processed into a plate-form or sheet-form or tape-form. In a state of having the above semiconductor devices 3, 4, 5, and 30 mounted thereon, by way of curving or folding, the substrate 2 can be provided with a layer-laminated formation as shown in FIG. 1. A plan-view formation of the substrate 2 is shown by means of a development view of FIG. 2 being illustrative of the construction of the substrate 2 shown in FIG. 1.

FIG. 2 is a summarized development illustrating four of the substrates 2 each having a semiconductor device thereon by way of spreading themselves into crossed formation. The first device 3, the second device 4, the third device 5, and the fourth device 30, are individually mounted on each of the four edge portions of the crossed substrates 2. The first-device mounting area for mounting the first device 3 is designated by reference code 61. The second-device mounting area for mounting the second device 4 is designated by reference code 62. The third-device mounting area for mounting the third device 5 is designated by reference code 63. The fourth-device mounting area for mounting the fourth device 30 is designated by reference code 64. Back surface (the upper surface of FIG. 1) of an externally connected terminal disposing area 6 shown in FIG. 2 is arranged to accommodate a stress-relaxing material such as a gelled adhesive agent 73, for example. The gelled adhesive agent functioning as a stress-relaxing material also serves to adhere a reinforcing plate 72 to be described later on. When using the gelled adhesive agent for relaxing stress, a highly viscose adhesive agent containing silicon can be introduced, and yet, it is also possible to use such an adhesive agent having analogous physical property. Further, it is also possible to use "die-bond" adhesive film generating viscosity at a high temperature for relaxing stress, which draws attention of the concerned as a substitute for "die-bond" Ag paste and has been put into practical use. Further, it is also possible to use such a material composed of elastomer for relaxing stress. The above-referred externally connected terminal disposing area 6 is fitted with a plurality of externally connected terminals 7 outside of the semiconductor apparatus shown in FIG. 1 (bottom side in FIG. 1).

Referring to a summarized development view shown in FIG. 2, details of the semiconductor apparatus according to the embodiment of the present invention will be described below. A plurality of electrode pads are formed on the part of a surface on which a circuit comprising the first device 3, the second device 4, the third device 5, and the fourth device 30, is formed. Further, a plurality of projected electrodes (bumps) 19 are formed on the above-referred electrode pads (refer to FIG. 1). The first device 3, the second device 4, the third device 5, and the fourth device 30, are respectively disposed in the prone posture, i.e., in the facedown posture. These four devices are electrically connected to externally conductive lands of a wiring substrate disposed below the first, second, third, and the fourth devices 3, 4, 5, and 30, and yet, mechanically linked with each other. Junction portions are filled with under-film material such as a film material comprising epoxy resin, for example.

The semiconductor-device mounting areas 61, 62, 63, and 64, for mounting the first device 3, the second device 4, the third device 5, and the fourth device 30, respectively, are independently formed.

In terms of assembling procedure, the first-device mounting area 61 complete with mounting of the first device 3 at the initial stage is independently provided.

Next, the independently formed area 61 for mounting the first device 3 is subject to analytical checking of electrical characteristics and other analytical measurements in the production process.

On the other hand, chip parts 40 and 42 such as a chip resistor and a chip capacitor, for example, are disposed on the upper surface of a wiring-distributing area 11 formed on one side of the first-device mounting area 61.

The above-referred area 61 for mounting the first device 3 formed on the plane surface and the wiring distributing area 11 of the first device 3 are connected to each other. The first-device mounting area 61 is an insulating material such as an opaque polyimide tape. Wiring material made of copper wire patterned into a predetermined form is set inside of the above-referred insulating material. Next, the wiring material and the wiring-distributing area 11 are connected to each other via a bump 19 (a gold bump, for example) made of an electrically conductive adhesive material by an ultrasonic welding method or the like.

Like the above process, the second device 4, the third device 5, and the fourth device 30, are then individually subject to analytical checking of their electrical characteristics. Next, a second-device mounting area 62, a second-device wiring distributing area 12, a third-device mounting area 63, a third-device wiring distributing area 13, a fourth-device mounting area 64, and a fourth-device wiring distribution area 50, are separately connected to the second device 4, the third device 5, and the fourth device 30 as shown in FIG. 2. Note that electrically conductive adhesive materials for connecting the above components parts such as gold bumps having thermally fusible adhesive property and thermally fusible property by a soldering process are designated by reference codes 19, 22, 24, and 29, in FIG. 1.

Reference codes "a", "b", "c", and "d", shown in FIGS. 1 and 2 respectively designate junction portions for connecting the above-referred semiconductor-device mounting areas 61, 62, 63 and 64 to the corresponding wiring distributing areas 11, 12, 13 and 50.

Further, in order to ensure leveling effect of the folded laminate, a reinforcing plate 72 (for example, made of a ceramics substrate) is secured to the back-surface side (upper portion shown in FIG. 1) of the externally connected terminal disposing area 6 by applying an adhesive agent 73 (made of highly viscose gelled adhesive resin, for example) being prominent in relaxing stress. As a result of the provision of an adhesive material prominent in relaxing stress and the above-referred reinforcing plate 72 on the part of the externally connected terminal disposing area 6, stress incurring at the time of folding each of the above-referred substrates can be relaxed, and yet, leveling effect advantageous to the device-mounting process can be achieved. Because of this, leveling of connected portions (such as interposer outer lands, for example) of the device-mounted substrate at the time of bonding balls can be achieved, thus guaranteeing satisfactory compatibility when actually mounting semiconductor devices.

On the other hand, component devices are serially laminated according to the sequential steps described below. Initially, the first-device mounting area 61 including the first device 3 formed on the level surface and the first-device wiring-distributing area 11 of the first device 3 are respectively disposed on the back-surface-side (upper portion in FIG. 1) of the externally connected terminal disposing area 6 by a folding process. In specific, the first-device mounting area 61 and the first-device wiring distributing area 11 are respectively adhered via a highly-viscose gelled adhesive agent 26 being prominent in relaxing stress spread on the upper surface of the reinforcing plate 72 secured on the back surface of the externally connected terminal disposing area 6. In particular, the back surface of the pronely disposed (down-faced) first device 3 is adhered to the area 6. At the same time, the chip parts 40 and 42 (a chip resistor and a chip capacitor, for example) are disposed on the lateral surface of the folded portion. In the same way, the second device 4, the third device 5, and the fourth device 30 discretely being bonded onto substrates are stacked with each other on a level surface. These three elements are sequentially folded in the direction of the back surface of the externally connected terminal disposing area 6 (in the upper direction), which are then adhered and three-dimensionally laminated. In FIG. 1, reference code 8 designates the first-device mounting area adhered with the first device 3. Reference code 9 designates the second-device mounting area adhered with the second device 4. Reference code 10 designates the third-device mounting area adhered with the third device 5. Reference code 31 designates the fourth-device mounting area adhered with the fourth device 30. Reference numerals 27, 28, and 33 respectively designate insulating adhesive agents such as highly-viscose gelled adhesive agents used for adhesion of the second device 4, the third device 5, and the fourth device 30.

Next, a radiating plate having thermally radiating property such as a copper plate, for example, is bonded on the uppermost polyimide substrate 2 with an adhesive agent 71 having satisfactory thermal conductivity. By virtue of the provision of the radiating plate 70, heat generated by the first device 3, the second device 4, the third device 5, and the fourth device 30, is radiated to lower thermal build-up. The adhesive agent 71 having satisfactory thermal conductivity can be prepared by way of mixing a highly adhesive material with particles having a high degree of thermal conductivity, for example. For example, combined use of an adhesive film such as the above-cited "die-bond" adhesive film with such particles having a high degree of thermal conductivity is suggested.

In the inventive semiconductor apparatus having the above described structure, despite of the disposition of the first device 3, the second device 4, the third device 5, and the fourth device 30, individually being complete with analytical checking of electrical characteristics on the leveled substrates, as a result of the process for folding them before lamination, respective elements are three-dimensionally laminated. Further, it is possible to realize such a laminate-type high-density package capable of bilaterally satisfying the demand for achieving higher function and downsizing of modern semiconductor apparatuses without sacrificing proper function of respective semiconductor devices and own strength of the package itself.

It should be understood that, not only the four semiconductor devices shown in FIG. 1, but the semiconductor apparatus of the present invention may also be composed of two or more than four of semiconductor devices as a practical form of application. Further, not only the crossed flat form shown in the wiring substrate plan view of FIG. 2, but a variety of forms including T-shaped configuration or L-shaped configuration may also be introduced. Further, in terms of connection between discretely split semiconductor-device mounting areas and wiring distributing areas, the upper and the lower connection may be reversed, and thus, the present invention can practically be implemented via various forms of laminate-type high-density packages.

As is clear from the above description, according to the semiconductor apparatus under the practical form of the present invention, a three-dimensionally laminated structure has been introduced by way of connecting a plurality of independently and discretely disposed semiconductor-device mounting areas to the corresponding wiring distributing areas, and yet, opaque polyimide substrates for mounting semiconductor devices have been introduced. Further, a radiating plate has been introduced in order to provide laminated semiconductor devices with heat-radiating function. Further a reinforcing plate has been introduced in order to level off externally connected terminal disposing areas and improve strength thereof. By virtue of the above arrangement, even when assembling a plurality of semiconductor device as a package, connection to externally connected boards can smoothly be achieved without losing own function of the package. As a result, the semiconductor apparatus of the present invention is ideally compatible with the demand for realizing higher mounting density and higher function, whereby making it possible to readily realize downsizing and thinning of a variety of electronic apparatuses.

As was described above, according to the semiconductor apparatus of the present invention, which comprises a plurality of laminate-type semiconductor devices laminated on a plurality of flexible substrates, there is no fear of incurring malfunction of the component elements due to thermal radiation, and yet, parts-connecting areas are fully leveled off and strong enough to ensure services, and thus, the semiconductor apparatus of the present invention provides distinctive advantage to facilitate higher mounting density.

What is claimed is:

1. A laminate-type semiconductor apparatus comprising a foldable flexible substrate and a plurality of semiconductor devices mounted on said foldable flexible substrate, wherein:

a plurality of semiconductor-device mounting areas of said foldable flexible substrate are laminated in layers via mutual superposition by way of folding said flexible substrate;

an externally connected terminal disposing area on which a plurality of externally connected terminals are disposed is formed on one surface of said flexible substrate;

a reinforcing plate is disposed on a side of said externally connected terminal disposing area via a material portion having stress relaxing function; and a heat-radiating plate disposed on a surface being opposite from said externally connected terminal disposing area of said flexible substrate.

2. The laminate-type semiconductor apparatus according to claim 1, wherein said reinforcing plate is a metallic plate.

3. The laminate-type semiconductor apparatus according to claim 1, wherein said material portion having stress relaxing function is an adhesive agent having stress relaxing function.

4. The laminate-type semiconductor apparatus according to claim 3 wherein said reinforcing plate is adhered to said substrate by said adhesive agent.

5. The laminate-type semiconductor apparatus according to claim 1, wherein said material portion having stress relaxing function is a gelled adhesive agent.

6. The laminate-type semiconductor apparatus according to claim 5 wherein said reinforcing plate is adhered to said substrate by said gelled adhesive agent.

7. The laminate-type semiconductor apparatus according to claim 1, wherein said flexible substrate is a polyimide substrate.

8. The laminate-type semiconductor apparatus according to claim 1 wherein said heat-radiating plate is bonded to said substrate with an adhesive agent having satisfactory thermal conductivity.

9. A laminate-type semiconductor apparatus comprising a foldable flexible substrate and a plurality of semiconductor devices mounted on said foldable flexible substrate, wherein:

a plurality of semiconductor-device mounting areas of said foldable flexible substrate are laminated in layers via mutual superposition by way of folding said flexible substrate;

an externally connected terminal disposing area on which a plurality of externally connected terminals are disposed is formed on one surface of said flexible substrate;

means for adhering a reinforcing plate on a side of said externally connected terminal disposing area with means for providing a stress relaxing function; and a heat-radiating plate disposed on a surface being opposite from said externally connected terminal disposing area of said flexible substrate with an adhesive agent having a suitable thermal conductivity.

* * * * *